United States Patent
Wiant et al.

(10) Patent No.: US 10,218,158 B1
(45) Date of Patent: Feb. 26, 2019

(54) ELECTRICAL POWER DISTRIBUTION ASSEMBLIES INCLUDING PIVOTABLE COMPARTMENT COMPONENT, ROTATABLE COMPARTMENT ASSEMBLIES, AND OPERATIONAL SERVICING METHODS

(71) Applicant: Siemens Industry, Inc., Alpharetta, GA (US)

(72) Inventors: Jason P. Wiant, Bedford, TX (US); Michael White, Glenn Heights, TX (US); Russell J. Wedemeyer, Colleyville, TX (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 0 days.

(21) Appl. No.: 15/864,212

(22) Filed: Jan. 8, 2018

(51) Int. Cl.
  *H02B 1/30* (2006.01)
  *H02B 1/32* (2006.01)
  *H02B 1/20* (2006.01)
  *H05K 7/16* (2006.01)
  *H02B 1/38* (2006.01)

(52) U.S. Cl.
  CPC ............ *H02B 1/306* (2013.01); *H02B 1/202* (2013.01); *H02B 1/32* (2013.01); *H02B 1/38* (2013.01); *H05K 7/16* (2013.01)

(58) Field of Classification Search
  CPC . H02B 1/30–1/48; H02B 1/565; H02B 1/202; H05K 7/16
  USPC .......... 361/600–640; 174/69, 72 A; 312/236; 248/65, 68.1, 74.3; 211/26; 379/438
  See application file for complete search history.

(56) References Cited

U.S. PATENT DOCUMENTS

| | | | | |
|---|---|---|---|---|
| 4,480,880 A | * | 11/1984 | Cather ................... | H05K 7/16 312/273 |
| 6,095,461 A | * | 8/2000 | Daoud ..................... | F16L 3/01 248/65 |
| 6,613,981 B1 | * | 9/2003 | Hathcock ............... | H02G 3/045 174/100 |
| 6,878,891 B1 | | 4/2005 | Josten et al. | |
| 7,277,273 B2 | * | 10/2007 | Smith .................. | H05K 7/1488 211/26 |
| 7,816,602 B2 | * | 10/2010 | Landry ................ | G02B 6/4452 174/50 |

(Continued)

OTHER PUBLICATIONS

Siemens Industry, Inc. "Siemens Skinny WL Sections"; Published by Siemens Industry, Inc. Oct. 2016; 5400 Triangle Parkway, Norcross, GA, USA; Order No. SMFL-SMWLS-0916.

*Primary Examiner* — Zachary Pape

(57) ABSTRACT

An electrical distribution cabinet switchgear component is disclosed. The electrical distribution cabinet switchgear component includes a compartment housing forming an internal compartment configured to contain secondary electrical components and configured to be coupled to a switchgear cabinet, a hinge assembly coupled to the compartment housing, and a wire guard coupled to the hinge assembly. Electrical distribution cabinet compartment assemblies, including the electrical distribution cabinet switchgear component and a frame connector configured to attach to a frame of a switchgear cabinet, electrical distribution cabinet assemblies, and methods of servicing electrical components located within an internal chamber of an switchgear cabinet are provided, as are other aspects.

10 Claims, 10 Drawing Sheets

(56) References Cited

U.S. PATENT DOCUMENTS

| | | | | |
|---|---|---|---|---|
| 7,828,567 | B2 * | 11/2010 | Bonvallat | H04Q 1/142 |
| | | | | 439/131 |
| 7,952,023 | B2 * | 5/2011 | Caveney | H01R 9/2416 |
| | | | | 174/135 |
| 9,007,746 | B2 | 4/2015 | Rajvanshi et al. | |
| 9,444,237 | B2 * | 9/2016 | Frojo | H02G 3/30 |
| 2017/0179695 | A1 * | 6/2017 | Marmonier | H02G 3/04 |

\* cited by examiner

ELECTRICAL POWER DISTRIBUTION ASSEMBLIES INCLUDING PIVOTABLE COMPARTMENT COMPONENT, ROTATABLE COMPARTMENT ASSEMBLIES, AND OPERATIONAL SERVICING METHODS

FIELD

The present disclosure relates to electrical power distribution apparatus and methods, and more particularly to internal compartments within electrical power distribution enclosures.

BACKGROUND

Electrical power distribution equipment, such as panelboards, switchgear, and switchboards can be used for housing electrical componentry. Switchgear and switchboard are general terms that encompass metal enclosures containing switching and/or interrupting devices, such as fuses and circuit breakers, and can include associated control, instrumentation, and metering devices, as well as assemblies of these devices together with connections to associated buses, electrical terminals, cables, and other supporting connection structures used for distribution of electric power.

Typical low voltage switchgear equipment is often an assembly composed of multiple cabinet sections. Some cabinet sections may include one or more circuit breakers therein. Other sections may include electrical buses and/or electrical terminals (e.g., lug connections). Some cabinet sections may include a fixed compartment that is configured to receive auxiliary components such as a control power transformer (CPT), programmable logic controller (PLC), disconnect(s), and/or meter(s). The rear of the respective cabinet sections is typically an open area for the routing of cables and bus bars to and from the electrical terminals (e.g., lug connections). However, conventional cabinet configurations may involve certain challenges for installers/users.

Thus a need exists in the art for improved electrical power distribution cabinets.

SUMMARY

According to a first aspect, an electrical distribution cabinet switchgear component is provided. The electrical distribution cabinet switchgear component includes a compartment housing forming an internal compartment configured to contain secondary control components and configured to be coupled to an electrical distribution cabinet, a hinge assembly coupled to the compartment housing, and a wire guard coupled to the hinge assembly.

According to another aspect, an electrical distribution cabinet compartment assembly is provided. The electrical distribution cabinet compartment assembly includes an electrical distribution cabinet switchgear component, comprising: a compartment housing forming an internal compartment configured to contain secondary control components, a hinge assembly coupled to the compartment housing, and a wire guard coupled to the hinge assembly; and a frame connector configured to attach to a frame of an electrical distribution cabinet.

According to another aspect, an electrical distribution cabinet assembly is provided. The electrical distribution cabinet assembly includes a switchgear cabinet including an internal chamber and a frame; and an electrical distribution cabinet switchgear component interconnected to the frame, comprising: a compartment housing forming an internal compartment configured to contain electrical components and configured to be received within the internal chamber of the switchgear cabinet, and a hinge assembly coupled to the compartment housing and interconnected to the frame and configured to allow the compartment housing to be pivotable out of the internal chamber such that the compartment housing is located entirely outside of the internal chamber.

According to yet another aspect, a method of servicing electrical components located within an internal chamber of a switchgear cabinet is provided. The method includes opening a door of the switchgear cabinet, pivoting open a compartment housing of an electrical distribution cabinet compartment assembly relative to the internal chamber such that the compartment housing is entirely outside of the internal chamber, accessing electrical components and connections in the internal chamber, and pivoting closed the compartment housing such that the compartment housing is again received within the internal chamber.

Still other aspects, features, and advantages of the present disclosure will be readily apparent from the following description by illustrating a number of example embodiments and implementations, including the best mode contemplated for carrying out the present invention. The present disclosure may also be capable of other and different embodiments, and its several details may be modified in various respects, all without departing from the substance and scope of the present disclosure. Accordingly, the drawings and descriptions are to be regarded as illustrative in nature, and not as restrictive. The disclosure covers all modifications, equivalents, and alternatives falling within the substance and scope of the claims.

BRIEF DESCRIPTION OF DRAWINGS

The drawings, described below, are for illustrative purposes only and are not necessarily drawn to scale. The drawings are not intended to limit the scope of the disclosure in any way.

DETAILED DESCRIPTION

Figure 1A:
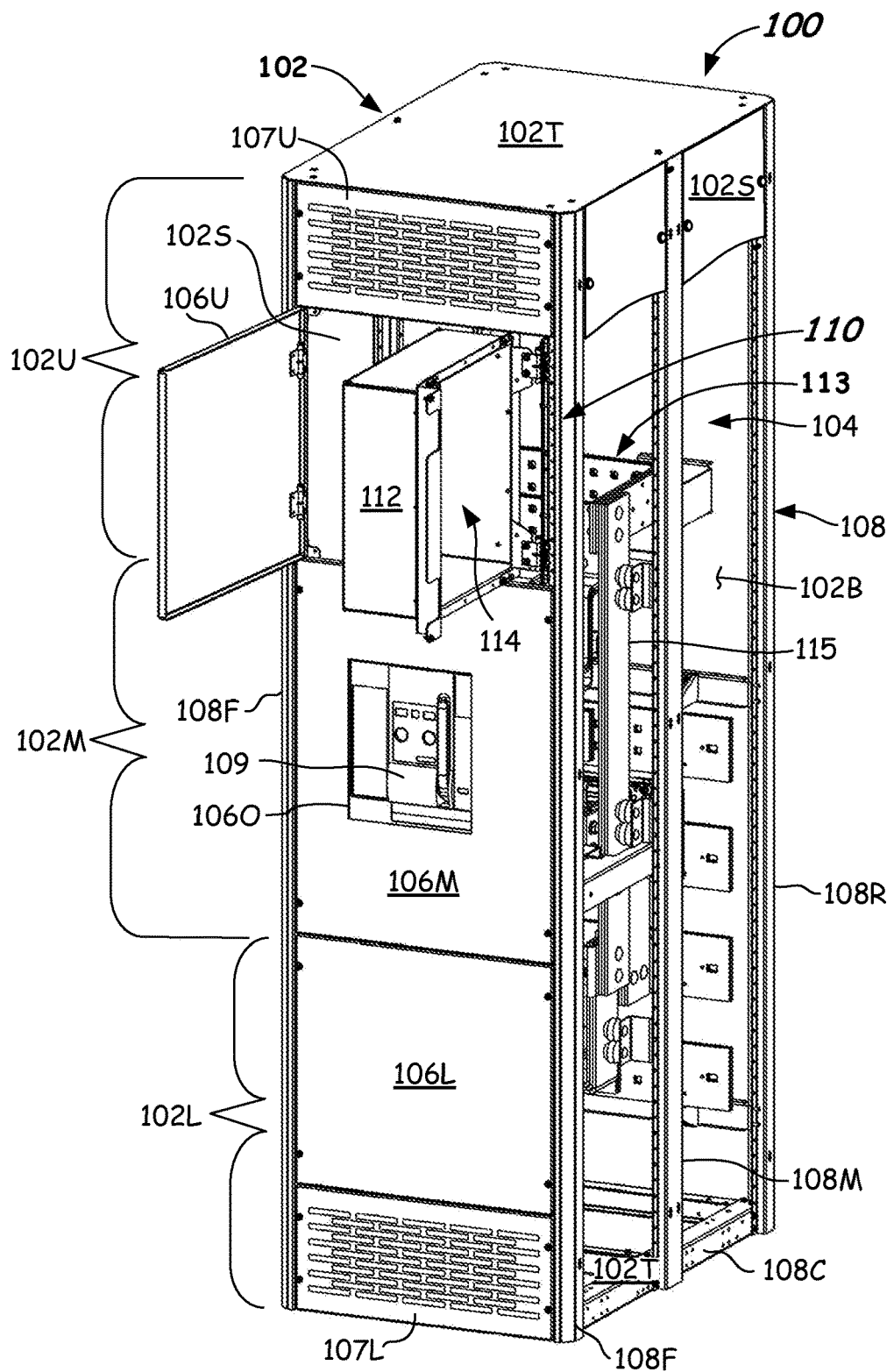
FIG. 1A illustrates a first front perspective view of an electrical distribution cabinet including an electrical distribution cabinet switchgear component having a pivotable compartment housing according to one or more embodiments (with part of the side removed for illustration purposes).

Reference will now be made in detail to various embodiments, examples of which are illustrated in the accompanying drawings. Wherever possible, the same reference numbers will be used throughout the drawings to refer to the same or like parts.

Existing conventional electrical distribution cabinets for providing electrical power distribution can include an internal chamber that houses internal electrical components, bus bars, electrical terminals, connected cables, and the like. Such electrical distribution cabinets may include multiple sections, wherein a section can include a fixed internal compartment that can be accessed through a compartment door that can pivot. Such fixed internal compartment may receive therein certain auxiliary components as discussed above.

However, such conventional systems are cumbersome in regards to servicing/maintenance and assembly, and make accessing the internal components behind the fixed internal compartment very difficult. In particular, the fixed internal compartment is in the way of access of components through the door. It is nearly impossible to remove the fixed compartment once all the auxiliary components are wired in, as the wiring that leaves the fixed internal compartment would essentially act as a tether. In some embodiments, the Aux fixed internal compartment can be relatively short in height thus allowing some space for the installer to reach around the fixed compartment to make the electrical connections in the rear of the internal chamber (e.g., line side incoming cable connections).

Accordingly, in view of the problems of the prior art, embodiments of the disclosure provide an electrical distribution cabinet switchgear component that includes a compartment housing that is configured to be pivotable relative to the internal chamber. An internal compartment of the compartment housing is configured to contain electrical components therein and electrical wire bundle connections thereto. The compartment housing is configured to be coupled to an electrical distribution cabinet, such as to a frame thereof. In particular, ability to pivot can be provided by a hinge assembly coupled to the compartment housing. A wire guard can be coupled to the hinge assembly and form part of a wire bundle channel configured to confine a wire bundle to a specific channel location relative to the compartment housing such that chafing and bending of wires therein is minimized. In some embodiments, the wire bundle is oriented vertically. In particular, wire bundle routing and confinement accomplished in embodiments provides twisting of the wire bundle which minimizes can stress on the wire bundle. The wire bundle routing channel formed by the wire guard and other assembly surfaces provides for routing in a compact area. The ability to pivot the compartment housing provides ease of, and rapid access to the region in the rear of the cabinet internal chamber behind the pivotable compartment housing.

The aforementioned problems of conventional electrical power distribution cabinets are overcome by one or more embodiments of the present disclosure. Accordingly, embodiments of the disclosure provide a compact and efficient electrical distribution cabinet enabling swift access to internal electrical connections and electrical components (e.g., bus bars, lug connections, cables, and the like) within an internal chamber of the electrical distribution cabinet. Electrical distribution cabinet switchgear components configured for pivotal attachment to a frame connector secured to frame of the cabinet, as well as electrical distribution cabinet compartment assemblies are provided. Methods of servicing electrical components located within an internal chamber of an electrical distribution cabinet are also provided. The disclosure will be explained in greater detail with reference to FIGS. 1A-5 herein below.

FIGS. 1A-1D illustrate an embodiment of an electrical distribution cabinet assembly 100 with some or all of side wall 102S remove to facilitate a view of the internal chamber components. The electrical distribution cabinet assembly 100 may be useful for providing electrical power distribution to one or more electrical loads, wherein the connection of cables connected to the loads are made within the electrical distribution cabinet assembly 100. Similarly, line-side connections to an electrical power source may be made within the electrical distribution cabinet assembly 100. The electrical distribution cabinet assembly 100 includes a switchgear cabinet 102, which is a box-like structure including walls and doors (e.g., side walls 102S, back wall 102B, top wall 102T, upper door 106U, middle door 106M, and lower door 106L, and upper and lower ventilation walls 107U, 107L). Ventilation walls 107U, 107L may be provided on the front of the switchgear cabinet 102 and facilitate heat removal from the switchgear cabinet 102, if needed. The side walls 102S, back wall 102B, top wall 102T, upper door 106U, middle door 106M, lower door 106L, and upper and lower ventilation walls 107U, 107L may all be attached to a frame 108, which provides a rigid support structure of the switchgear cabinet 102. The frame may include a multi-piece sub-structure of interconnected frame channels. The respective walls and doors form an internal chamber 104. Internal chamber 104 is configured to include space therein for internal electrical components such as bus bars 115 and lug connectors 117, which may be located at a rear portion of the internal chamber 104.

Frame 108 may include front frame uprights 108F that are configured to allow attachment of doors (e.g., upper door 106U, middle door 106M, lower door 106L, and ventilation walls). Frame 108 can include rear frame uprights 108R, and may include middle frame uprights 108M in some embodiments. Side walls 102S can attach to front frame uprights 108F, rear frame uprights 108R, and/or middle frame uprights 108M, such as with fasteners (e.g., screws). Frame 108 can include cross frame members 108C, which can fasten to front frame uprights 108F, rear frame uprights 108R, and middle frame uprights 108M to form a rigid interconnected frame structure. Top wall 102T can attach to cross frame members 108C and/or other frame uprights 108B, 108M, 108F.

Some or all of doors 106U, 106M, 106L may include one or more hinges (like shown on upper door 106U) and thus may be pivotable relative to frame 108. For example, as shown, upper door 106U can be pivotable relative to the front frame upright 108F. Opening the upper door 106U exposes and allows access to an electrical distribution cabinet compartment assembly 110 in accordance with embodiments including a compartment housing 112 having an internal compartment 114 formed therein. Electrical distribution cabinet compartment assembly 110 is shown behind upper door 106U. However, it should be understood that an electrical distribution cabinet compartment assembly identical to electrical distribution cabinet compartment assembly 110 could be provided behind the lower door 106L. Thus, it should be recognized that the electrical distribution cabinet compartment assembly 110 can be provided in conjunction with, and behind, either a pivotable door (like 106U) or with a fixed door (like lower door 106L).

In the depicted embodiment, lower door 106L may be a fixed door (not pivotable) and may be attached to the front frame uprights 108F by suitable fasteners (e.g., screws, fast disconnects, or locking fasteners such as ¼ turn fasteners). Likewise, in the depicted embodiment, middle door 106M may be a fixed door (not pivotable) and may be attached to the front frame uprights 108F by suitable fasteners like outlined above. Middle door 106M may include an opening therein allowing access to a circuit breaker 109, which may be a molded case or power circuit breaker, or fusible switch, for example, which provide the means of disconnecting the primary power in the equipment.

As shown, doors 106U, 106M, 106L and ventilation walls 107U, 107L may form various sections, such as upper section 102U, middle section 102M, and lower section 102L, each of which may be accessed by opening or removal of doors 106U, 106M, 106L. More or less doors may be provided thus providing one or more sections. Moreover, other configurations of the switchgear cabinet 102 may be used.

Figure 1B:
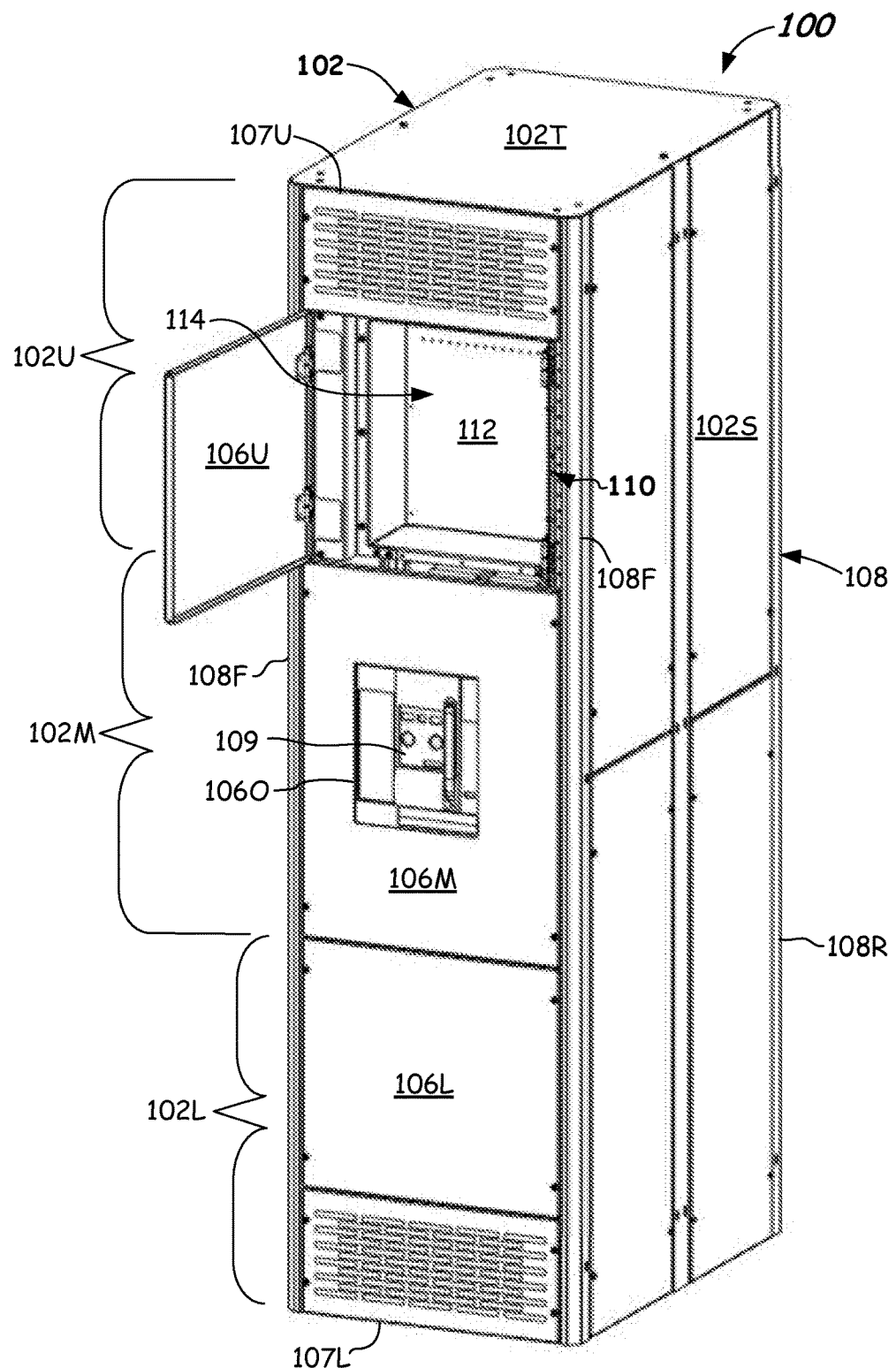
FIG. 1B illustrates a second front perspective view of an electrical distribution cabinet including an electrical distribution cabinet switchgear component having a pivotable compartment housing shown in a condition where the pivotable compartment housing is contained fully within the internal chamber of the cabinet according to one or more embodiments.
Figure 1C:
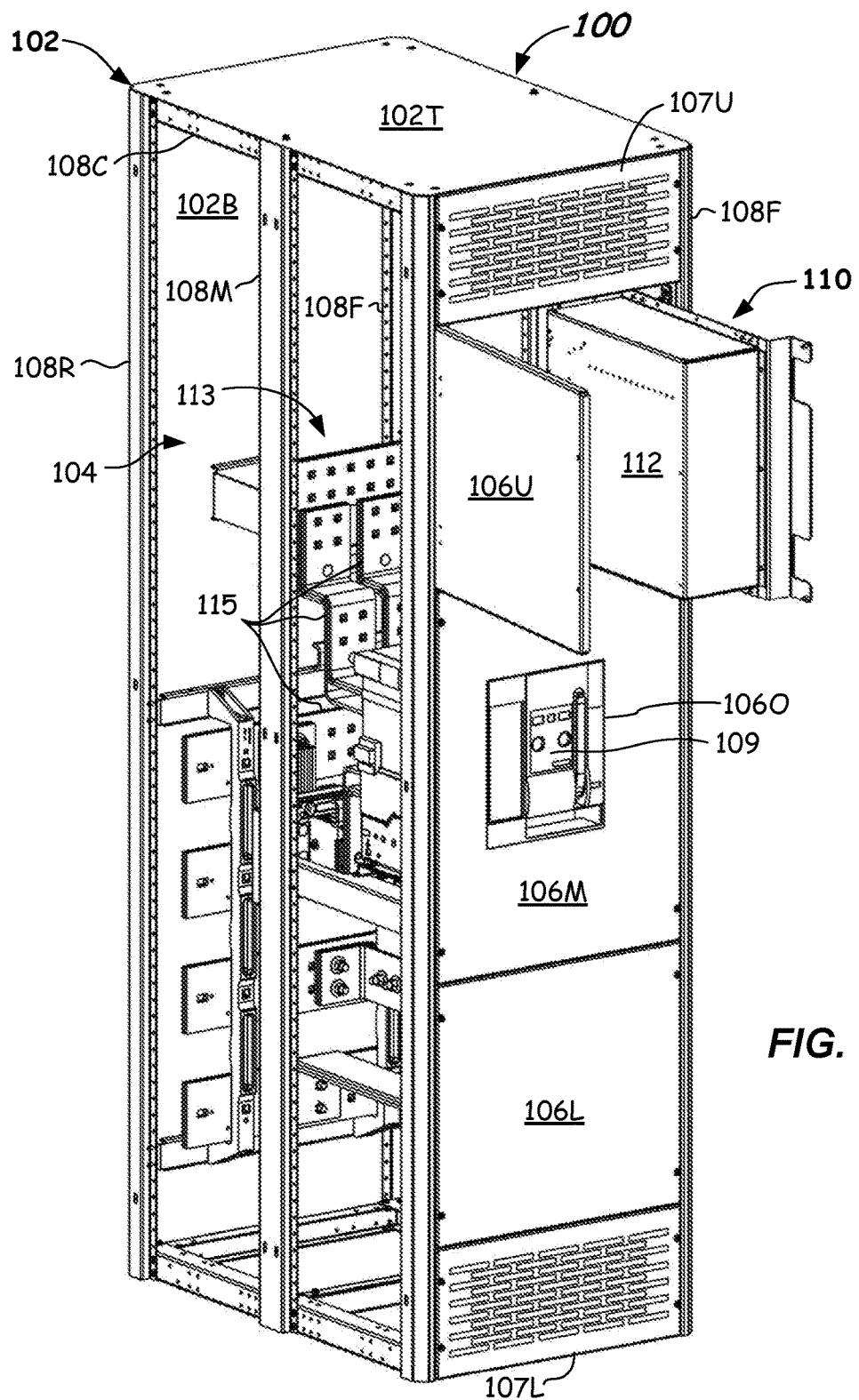
FIG. 1C illustrates a third front perspective view of an electrical distribution cabinet including an electrical distribution cabinet switchgear component having a pivotable compartment housing shown partially pivoted out if the cabinet according to one or more embodiments (with left side removed for illustration purposes).

As shown in FIG. 1B, when the door 106U to upper section 102U is initially opened (pivoted open on hinges), the electrical distribution cabinet compartment assembly 110 including compartment housing 112 forming the internal compartment 114 is exposed. As will be apparent from the following, the compartment housing 112 is pivotable relative to the frame 108 (e.g., relative to the front frame upright 108F). This allows an operator to have direct and easy access to the internal components 113 lying behind the compartment housing 112, such as bus bars 115 and terminal connectors 117.

Now referring to FIGS. 2 through 4C, the electrical distribution cabinet compartment assembly 110 is shown. The electrical distribution cabinet compartment assembly 110 includes a frame connector 216 configured to attach to the frame 108 of the electrical distribution cabinet assembly 100, such as to the front frame upright 108F, and an electrical distribution cabinet switchgear component 218. The electrical distribution cabinet switchgear component 218 comprises the compartment housing 112 forming the internal compartment 114, a hinge assembly 220, and a wire guard 222.

Figure 1D:
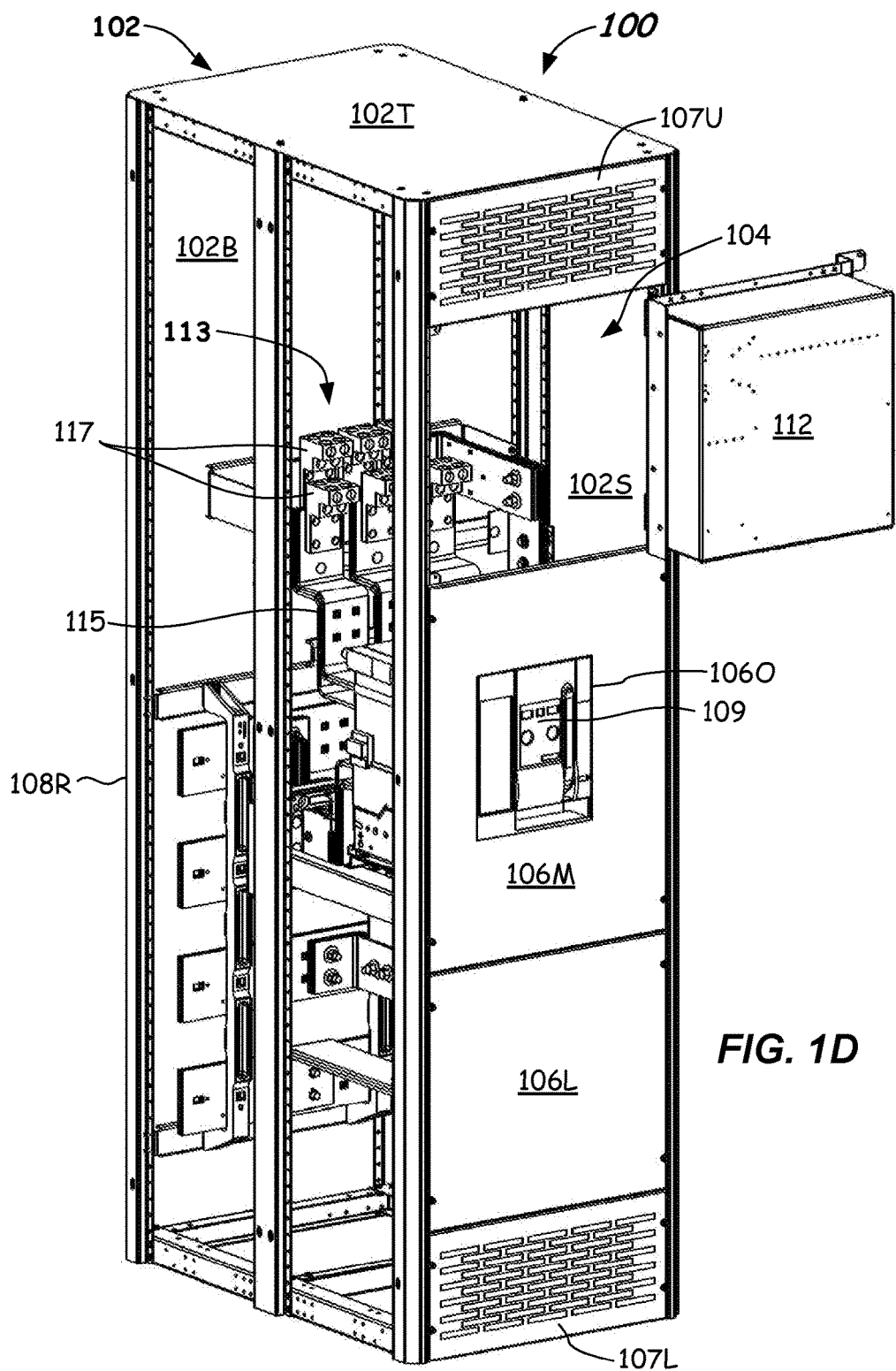
FIG. 1D illustrates a fourth front perspective view of an electrical distribution cabinet including an electrical distribution cabinet switchgear component including a pivotable compartment housing shown being fully pivoted out if the internal chamber of the cabinet according to one or more embodiments (with left side removed for illustration purposes).

In more detail, the compartment housing 112 forming the internal compartment 114 can be configured to contain secondary control components, such as control power transformer (CPT), programmable logic controller (PLC), disconnect(s), and/or a meter(s), for example. The compartment housing 112 is sized and configured to be received fully within the internal chamber 104 of the switchgear cabinet 102 and behind the door (e.g., upper door 106U) when the door is closed. The compartment housing 112 may include compartment walls (e.g., side walls 212S, a top wall 212T, and a bottom wall 212B) forming the internal compartment 114, which can have a rectangular prism internal volume configured to receive electrical components and a portion of a wire bundle therein. As shown in FIG. 1D, the compartment housing 112 may be pivotable out of the internal chamber 104 to allow access to internal components 113 in the internal chamber 104 (e.g., bus bars 115, lug connections 117, and the like), such as at the rear of the internal chamber 104. In particular, providing a compartment housing 112 that is pivotable out of the internal chamber 104 can enable an installer/user to readily gain access to the rear of the internal chamber 104 in order to add lug connections 117 and/or connect or disconnect electrical cables that are coupled to external electrical loads (loads external to the electrical distribution cabinet assembly 100) to/from the lug connections 117 and also to facilitate making line side connections.

Figure 2:
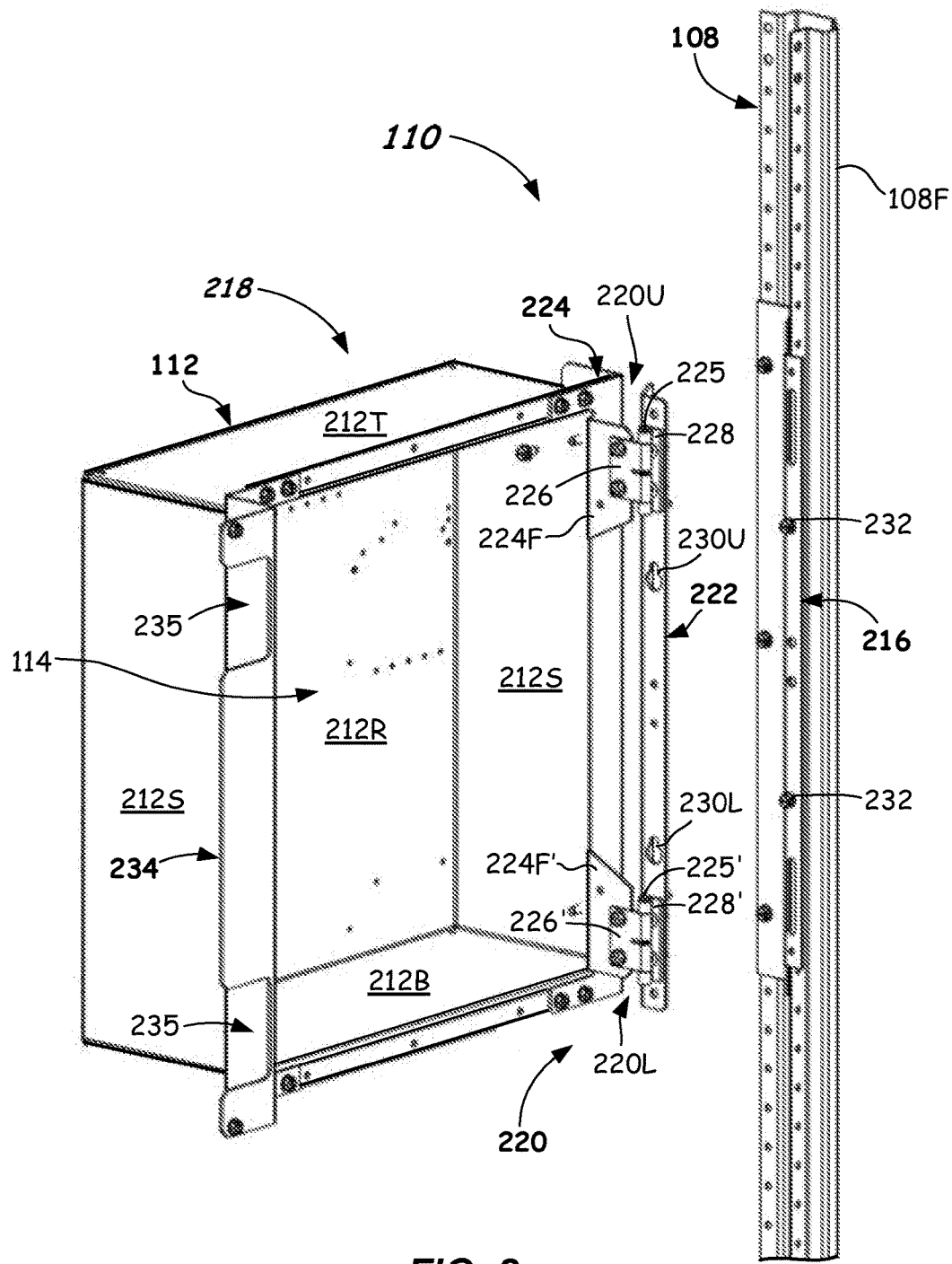
FIG. 2 illustrates a partially exploded, front perspective view of an electrical distribution cabinet switchgear component having a pivotable compartment housing and pivotable mounting structure configured to interconnect the compartment housing to a frame according to embodiments.

The pivoting of the compartment housing 112 is facilitated by a suitable hinge assembly 220. For example, as shown in FIG. 2, the hinge assembly 220 is coupled to the compartment housing 112. In the depicted embodiment, the hinge assembly 220 can include a first (e.g., upper) hinge assembly 220U, a second (e.g., lower) hinge assembly 220L, and a hinge mount bracket 224. The first hinge assembly 220U includes a first inner hinge component 226 coupled to the hinge mount bracket 224, and a first outer hinge component 228 configured to be pivotable relative to the first inner hinge component 226, such as by a first hinge pin 225, wherein the first outer hinge component 228 is configured to be coupled to the wire guard 222, whose structure and function are described further herein.

The second hinge assembly 220L can include an second inner hinge component 226' coupled to the hinge mount bracket 224, and a second outer hinge component 228' pivotal relative to the second inner hinge component 226', such as by a second hinge pin 225', wherein the second outer hinge component 228' is configured to be coupled to the wire guard 222.

Figure 3:
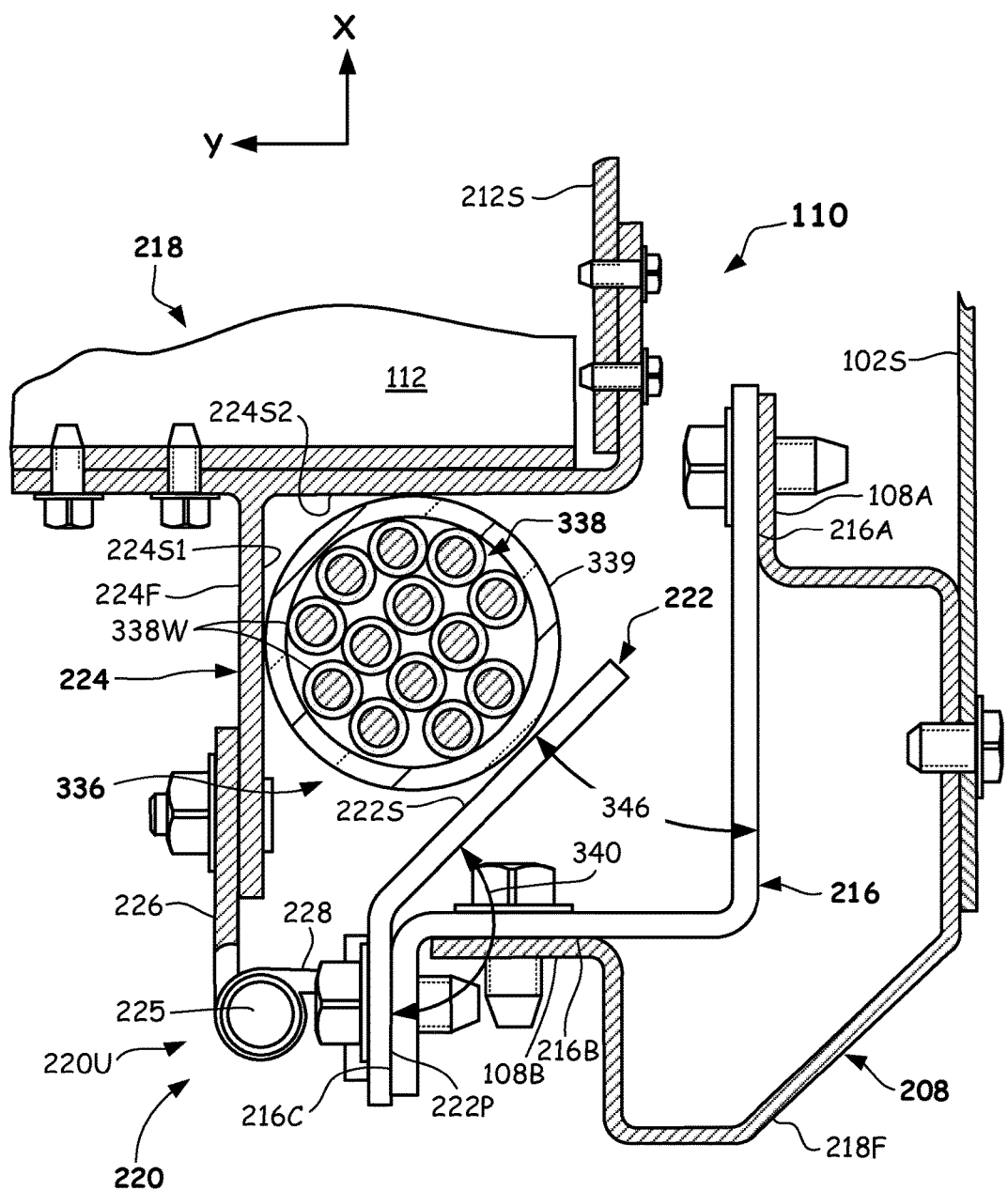
FIG. 3 illustrates a partially cross-sectioned, partial top view of an electrical distribution cabinet switchgear component having a pivotable compartment housing and mounting structure thereof and illustrating an electrical cable confined to a routing channel according to embodiments.

As shown in top view in FIG. 3, the hinge mount bracket 224 includes a first mounting flange 224F configured to mount and attach the first inner hinge component 226 (e.g., by screws or the like), wherein the first mounting flange 224F can extend co-parallel to a side wall 212S of the compartment housing 112. Likewise, the hinge mount bracket 224 can include a second mounting flange 224F' configured to mount and attach the second inner hinge component 226' (e.g., by screws or the like), wherein the second mounting flange 224F' can extend co-parallel to one or both of the side walls 212S of the compartment housing 112.

In the depicted embodiment, the wire guard 222 is coupled to the hinge assembly 220, and the wire guard 222 can be connectable to the frame connector 216. For example, as shown the first (e.g., upper) hinge assembly 220U can attach (e.g., via screws or the like) to one end of the wire guard 222 and the second hinge assembly 220L can attach (e.g., via screws or the like) to another end of the wire guard 222. Thus, the hinge assembly 220 includes a first outer hinge component 228 and a second outer hinge component 228' each being coupled to the wire guard 222.

As shown in FIGS. 2 and 3, the frame connector 216 can comprise an elongated member having multiple bends forming multiple planar surfaces thereon. As shown, the wire guard 222 includes a planar portion of surface 222P that is configured to abut with and couple to the frame connector 216. For example, the wire guard 222 can include a plurality of hanging connection features 230U, 230L that are configured to allow the electrical distribution cabinet switchgear component 218 including the compartment housing 112, hinge assembly 220, and the wire guard 222, to be hung onto the frame connector 216. The hanging connection features 230U, 230L can comprise key-hole slots, for example, that can be received over a starter member 232 (e.g., a screw, post, or the like) provided on the frame connector 216. This allows ease of assembly of the wire guard 222 to the frame connector 216 and thus ease of assembly of the electrical distribution cabinet switchgear component 218 to the frame connector 216. Once installed in place, additional screws can be received through other mounting holes in the wire guard 222 and tightened to secure the wire guard 222 to the frame connector 216.

As best shown in FIG. 3, the wire guard 222 can form one surface of a routing channel (see routing channel 336) that can be configured to route a wire bundle 338 therein. As can be seen, when the compartment housing 112 is in a closed condition (pivoted into the internal chamber 104), the wire bundle 338 is confined to the routing channel 336 at locations adjacent to the first (upper) mounting flange 224F or second (lower) mounting flange 224F'. Routing channel 336 is oriented vertically alongside of the hinge assembly 220 and provides a channel for confining the wire bundle 338 therein when in a close condition.

The frame connector 216 can be an intermediate piece that aids the connection of the electrical distribution cabinet switchgear component 218 to the frame 108 of the switchgear cabinet 102. For example, as shown in FIG. 3, the frame connector 216 includes a first side 216A configured to couple to a first portion 108A of the front frame upright 108F of the frame 108 and a second side 216B that can be substantially perpendicular to the first side 216A and is configured to couple to a second portion of a rear frame upright 108B of the frame 108. The frame connector 216 can further include a third side 216C that can be substantially perpendicular to the second side 216B wherein the wire guard 222 is coupleable to the third side 216C. Thus, the frame connector 216 functions to make the frame 108 more rigid and to provide a suitable connection point for the electrical distribution cabinet switchgear component 218. In particular, a fast connection may be facilitated in some embodiments.

Figure 4A:
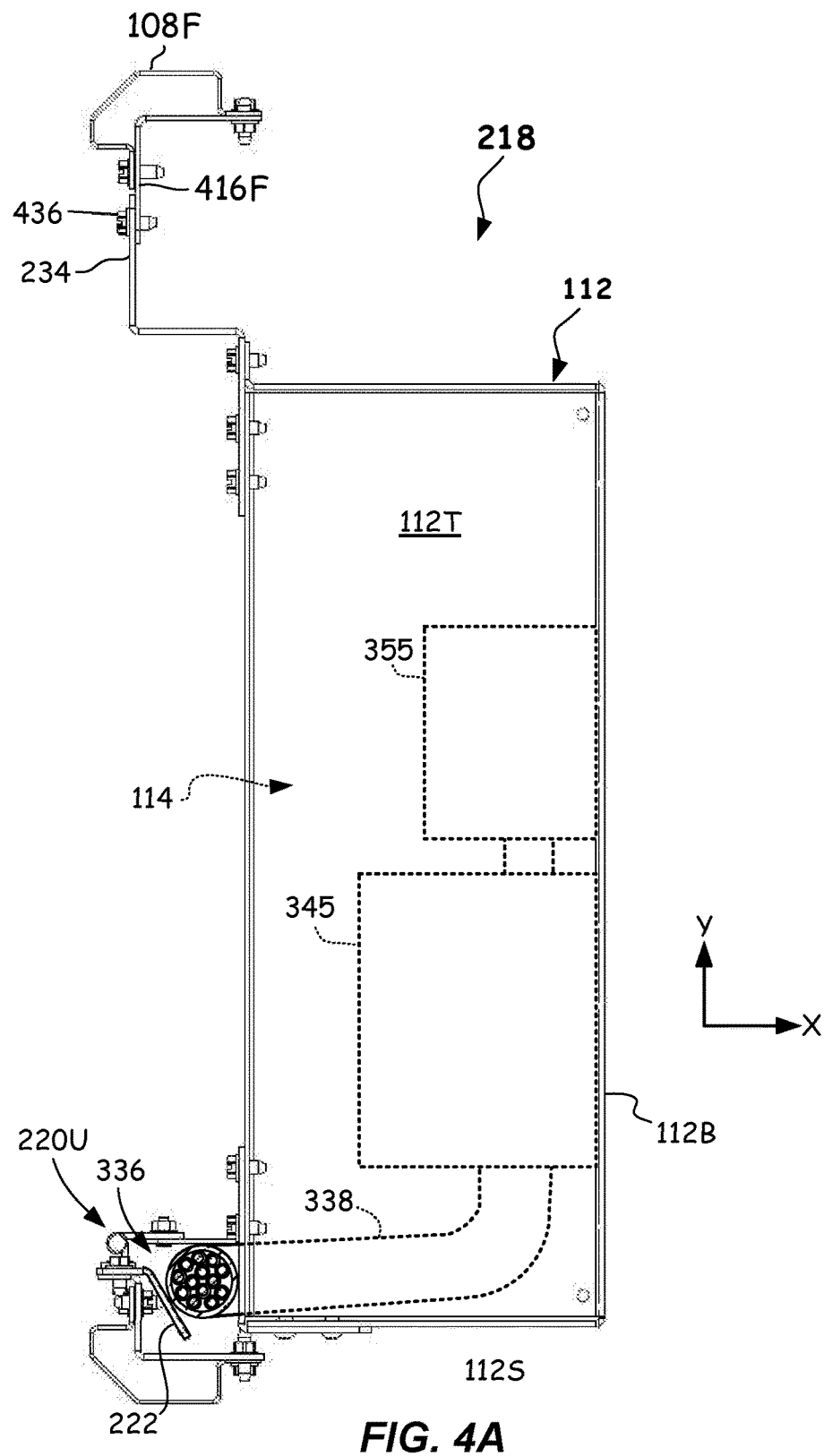
FIG. 4A illustrates a top plan view of an electrical distribution cabinet switchgear component installed onto portions of a frame of a switchgear cabinet and illustrating electrical wire bundle routing according to embodiments.

As best shown in FIGS. 2 and 4A, the compartment housing 112 of the electrical distribution cabinet switchgear component 218 can further include a mounting flange 234 located on an opposite side of the internal compartment 114 from the hinge assembly 220 and wire guard 222. The mounting flange 234 can be used to secure the compartment housing 112 of the electrical distribution cabinet switchgear component 218 to a front frame upright 108F on a side of the switchgear cabinet 102 opposite from the hinge assembly 220. For example, the mounting flange 234 can be attached and secured to a second frame support 416F by fasteners 436 (screws or the like). Optionally, a lock or latch mechanism could be used securing the mounting flange 234 to the second frame support 416F. In the depicted embodiment, the mounting flange 234 can include one or more wire bundle routing recesses 235. The one or more wire bundle routing recesses 235 may be sized and configured to allow a wire bundle to be routed there through, such as routed to components mounted on the door 106U, for example.

Referring again to FIG. 3, in another broad aspect, various portions of the hinge assembly 220 and the wire guard 222 may cooperate to form at least one routing channel 336 configured to route a wire bundle 338. For example, as shown in FIG. 3, generally perpendicular surfaces 224S1 and 224S2 of the hinge mount bracket 224 and an engaging surface 222S of the wire guard 222 can form the routing channel 336. The routing channel 336 is configured to route a wire bundle 338 in the area directly adjacent to the upper or lower hinge 220U, 220L, depending on how the wire bundle 338 is routed. Wire bundle 338 may include a plurality of wires 338W arranged in a bundle. Wires 338W may be insulated conductive wires, for example. A sheath 339 may surround the wire bundle 338 and offer further protection from chafing of the plurality of wires 338W as the compartment housing 112 is pivoted.

In some embodiments, the routing channel 336 can be configured to have three surfaces (e.g., three planar surfaces). As depicted, the surfaces 224S1, 224S2, 222S provide inwardly-facing planar surfaces that are arranged at angles to one another and configured to confine the wire bundle 338 to a particular location when the compartment housing 112 is closed (not pivoted out of the internal chamber 104). Surfaces 224S1, 224S2, 222S can include planar portions. Other configurations of the routing channel 336 are possible. For example, one of the routing channel surfaces could be a surface of the compartment housing 112.

One of the surfaces, namely the engaging surface 222S of the wire guard 222, can be formed by providing the wire guard 222 with an included bend angle 340 of between about 110 degrees and 160 degrees, or even between about 110 degrees and 130 degrees, and with a nominal bend angle 340 of about 120 degrees in some embodiments. The bend angle 340 is measured between a back surface on an opposite side of the wire guard 222 from the engaging surface 222S and the surface 222P that couples to the third side 216C of the frame connector 216, and helps maximize the space available to route the wire bundle 338 therein. Moreover, in some embodiments, the frame connector 216 has the first side 216A configured to couple to the first portion 108A of the frame 108 and the wire guard 222 forms the engaging surface 222S that can be a planar surface that is oriented at an offset angle 346 between about 20 degrees and about 70 degrees, or even between about 50 degrees and about 70 degrees, from the first side 216A. In some embodiments, the door 106U may be secured on the non-pivoting side to the frame upright 218F, by any suitable fastener(s) or latch. In some embodiments, where there is no electrical connection to the door, the door may be a fixed, non-pivoting door.

Figure 4B:
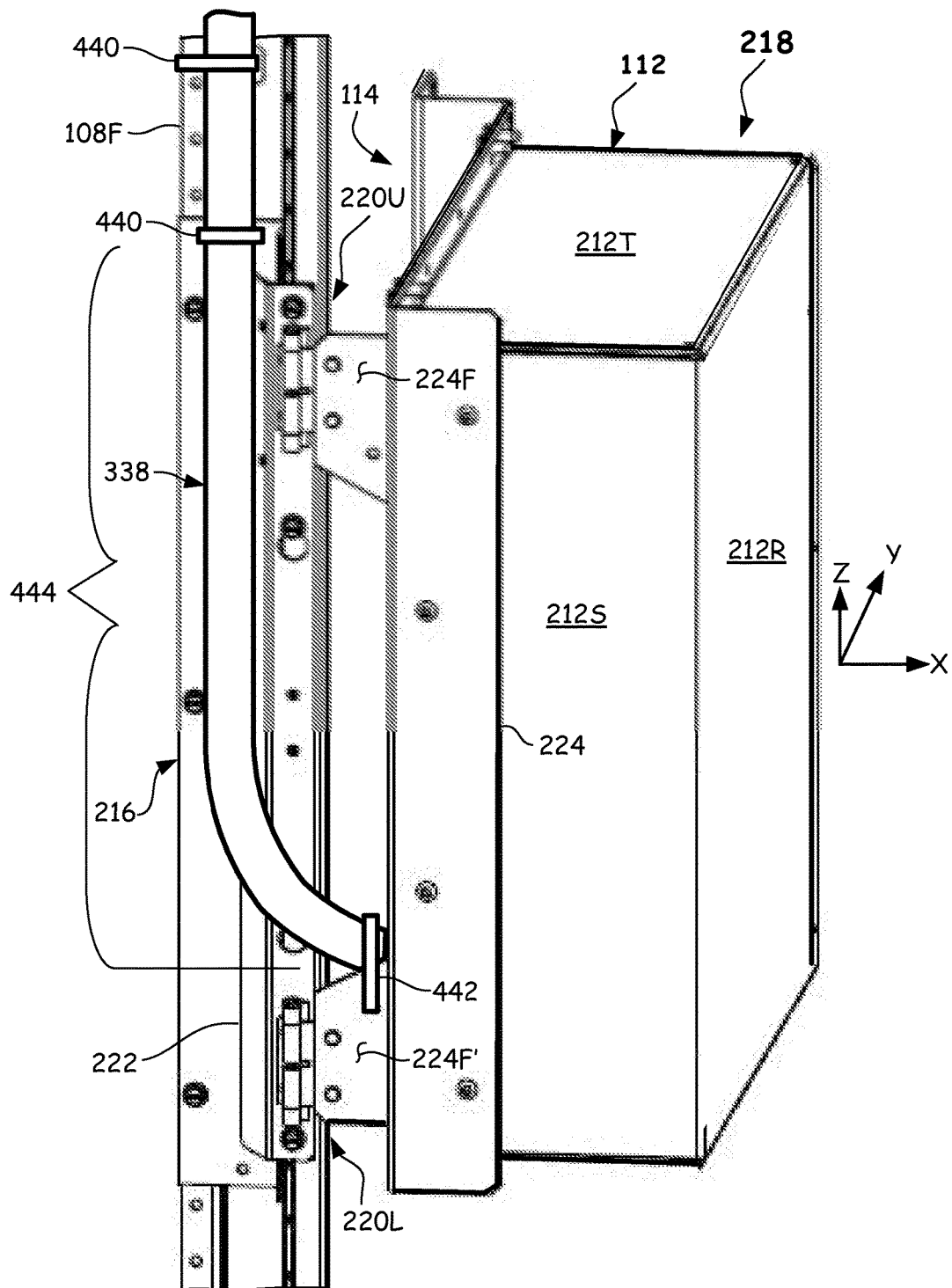
FIG. 4B illustrates a perspective view of routing of a wire bundle within an electrical distribution cabinet compartment assembly that is coupled to a frame portion according to embodiments.
Figure 4C:
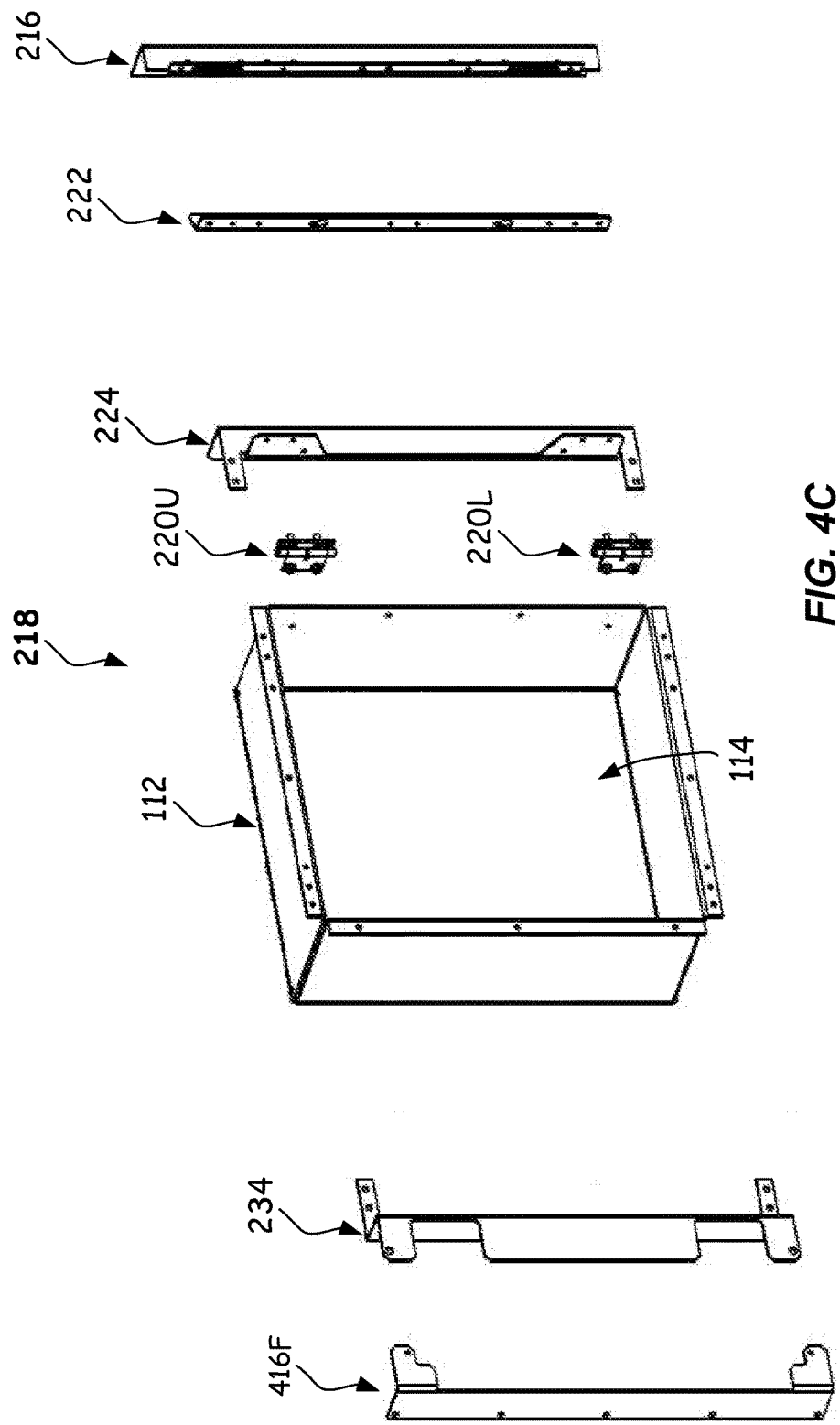
FIG. 4C illustrates an exploded perspective view of components of an electrical distribution cabinet compartment assembly according to embodiments.

As shown in FIG. 4A, the wire bundle 338 (the portion within the internal compartment 114 shown dotted) may be attached to one or more secondary electrical components 345, 355 that are installed within the internal compartment 114. As shown, the routing channel 336 can provide inwardly-facing surfaces (e.g., planar surfaces) that together are configured to confine the wire bundle 338 to a particular location in the X-Y plane and confined to an approximately vertical orientation adjacent to one of hinge assemblies 220U, 220L. However, between the upper and lower hinge assemblies 220U, 220L, the wire bundle 338 may gently traverse into the internal compartment 114. As shown in FIG. 4B, in the depicted embodiment, the wire bundle 338 traverses vertically in the Z direction from above through the routing channel 336 (when closed as shown in FIG. 3) formed by the surfaces 222S, 224S1, and 224S2 at the upper hinge assembly 220U and then passes into the internal compartment 114 in the X direction (or combination of X and Y) in between the upper and lower hinge assemblies 220U, 220L where connections to the one or more secondary electrical components 345, 355 can be made. Optionally, the wire bundle 338 could traverse vertically from below through the routing channel 336 formed by the surfaces equivalent to surfaces 222S, 224S1, and 224S2 (of FIG. 3) around the lower hinge assembly 220L and then passes into the internal compartment 114 in between the upper and lower hinge assemblies 220U, 220L. The wire bundle 338 may be secured at one or more locations around the upper hinge 220U (as shown) by upper connectors 440 and may also be secured at one or more locations around the lower hinge 220L (as shown) by lower connector 442. Upper connector(s) 440 may be one or more zip ties or the like that pass through securing holes (not shown) in the frame upright or frame connector 216. Likewise, lower connector 442 may be a zip tie or the like that passes through a securing hole (not shown) adjacent to the lower hinge 220L, such as to a fixed part of the lower hinge 220L in the second mounting flange 224F'. The wire bundle 338 is not being otherwise constrained between the two hinges assemblies 200L, 220U.

In an embodiment, where the wire bundle 338 is routed from below the compartment housing 112, the wire bundle 338 may be secured at one or more locations around the lower hinge 220L by one or more lower connectors (like connector (s) 440) and may also be secured at one or more locations around the upper hinge 220U by an connector (like lower connector 442).

Thus, as the compartment housing 112 is pivoted on the hinge assemblies 220U, 220L, the wire bundle 338 is exposed to only slight twisting along its length such as between the upper and lower hinges 220U, 220L (e.g., between upper connector and lower connector) and any substantial localized bending is avoided. Thus, the strain relief section 444, which is unconstrained between the respective hinges 220L, 220U allows the wires 338W in the wire bundle 338 to be exposed to less chafing and less bending stress.

In summary, it should be recognized that in some embodiments, an electrical distribution cabinet switchgear component 218 configured to attach to a switchgear cabinet 102 is provided. The electrical distribution cabinet switchgear component 218 comprises a compartment housing 112 forming an internal compartment 114 configured to contain electrical components (e.g., secondary electrical components), a hinge assembly 220 coupled to the compartment housing 112, and a wire guard 222 coupled to the hinge assembly 220. The wire guard 222 assists in confining the wire bundle 338 to a defined routing channel 336 and can aid in assembly of the electrical distribution cabinet switchgear component 218 to the frame 108 of the electrical distribution cabinet assembly 100.

In other embodiments, an electrical distribution cabinet compartment assembly 110 is provided. The electrical distribution cabinet compartment assembly 110 comprises an electrical distribution cabinet switchgear component 218 as described above, and a frame connector 216 configured to attach to a frame 108 of a switchgear cabinet 102.

In other embodiments, an electrical distribution cabinet assembly 100 is provided. The electrical distribution cabinet assembly 100 comprises the switchgear cabinet 102 including an internal chamber 104 and a frame 108; and an electrical distribution cabinet compartment assembly 110, wherein the electrical distribution cabinet compartment assembly 110 comprises a frame connector 216 attached to the frame 108, and an electrical distribution cabinet switchgear component 218. The electrical distribution cabinet switchgear component 218 comprises a compartment housing 112 forming an internal compartment 114 configured to contain electrical components (e.g., secondary electrical components) and configured to be received within the internal chamber 104 of switchgear cabinet 102, but be pivotal out of the internal chamber 104 to allow access to components (e.g., bus bars 115, lug connections 117, cables, line-side connections, and the like) located, for example, at a rear of the internal chamber 104, a hinge assembly 220 coupled to the compartment housing 112, and a wire guard 222 coupled to the hinge assembly 220, wherein the wire guard 222 is coupled to the frame connector 216.

As should be recognized, this configuration allows the compartment housing 112 forming the internal compartment 114 to be interconnected to the frame 108 and thus be pivotable relative to the switchgear cabinet 102 to an extent. For example, the compartment housing 112 when pivoted out of the internal chamber 104 from its closed condition (shown in FIG. 1B) can be rotated such that the compartment housing 112 is located entirely outside of the internal chamber 104 (See FIG. 1D). Lesser amounts of pivoting are possible. For example, the compartment housing 112 is configured to be pivotable out of the internal chamber 104 to a degree greater than 120 degrees from the closed condition (shown in FIG. 1B). Further, the compartment housing 112 can be configured to be pivotable out of the internal chamber 104 to a degree greater than 150 degrees from the closed condition, and even to about 180 degrees from the closed condition in some embodiments. This enlarges the access opening so that it is unimpeded by the compartment housing 112, thus making it easier for the installer to access the rear portions of the internal chamber 104.

The compartment housing 112 forming the internal compartment 114 is received behind a compartment door (e.g., 106U), which itself may be a pivotable door or simply a removable fixed door.

Figure 5:
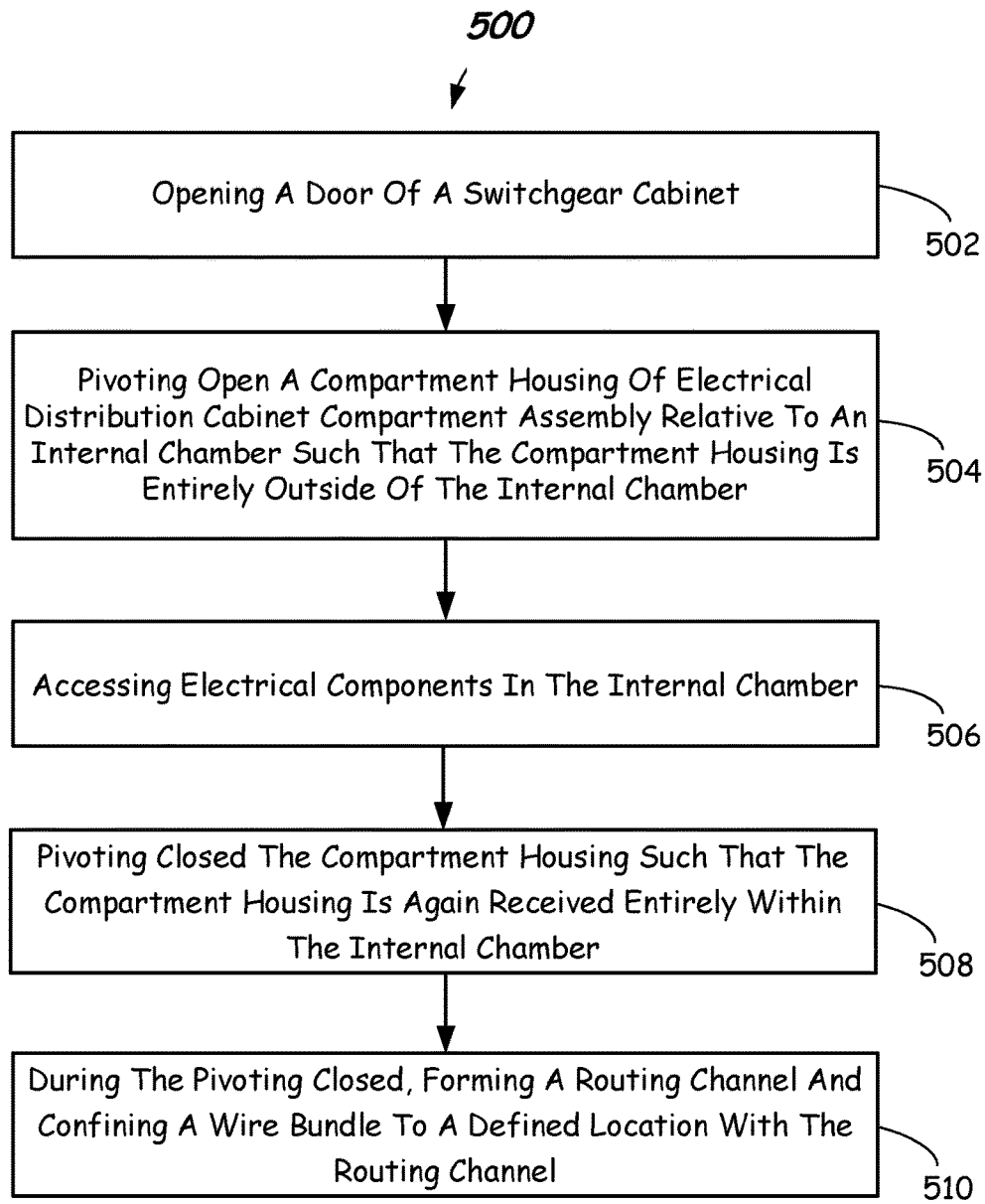
FIG. 5 is a flowchart of a method of servicing electrical components located within an internal chamber of an electrical distribution cabinet according to embodiments.

A method of servicing electrical components located within an internal chamber (e.g., internal chamber 104) of a switchgear cabinet (e.g., switchgear cabinet 102 of electrical distribution cabinet assembly 100) will now be described with reference to FIG. 5. The method 500 includes, in 502, opening a door (e.g., upper door 106U) of the switchgear cabinet (e.g., switchgear cabinet 102). This exposes the compartment housing 112 of electrical distribution cabinet switchgear component 218. Thus, the electrical components within the internal compartment 114 can be directly assessed by an operator for maintenance, inspection, and/or testing. If access to the internal chamber 104 behind the internal compartment 114 is desired, then the operator can remove securing fasteners 436 coupling the mounting flange 234 to the second frame support 416F.

The method 500, can then include, in 504, pivoting open a compartment housing (e.g., compartment housing 112) of the electrical distribution cabinet compartment assembly (e.g., electrical distribution cabinet compartment assembly 110) relative to the internal chamber (e.g., internal chamber 104) such that the compartment housing (e.g., compartment housing 112) is located entirely outside of (external to) the internal chamber (e.g., internal chamber 104). As explained above, the extent of rotation out of the internal chamber 104 may be greater than 120 degrees, greater than 150 degrees, or up to about 180 degrees (or even more) from the closed condition shown in FIG. 1B.

Once the compartment housing 112 is rotated out of the internal chamber 104, the method 500 can include, in 506, accessing electrical components (e.g., electrical components such as bus bars 115 and/or lug connections 117 and electrical line or load connections such as electrical cable connections) in the internal chamber (e.g., internal chamber 104), such as at a rear thereof.

Following the accessing electrical components in 506, the compartment housing (e.g., compartment housing 112) is pivoted closed in 508 such that the compartment housing 112 is again received within the internal chamber (e.g., internal chamber 104).

The method 500 can include, during the pivoting closed in 508, forming a routing channel (e.g., routing channel 336) in 510 that is configured to confine a wire bundle (e.g., wire bundle 338) to a desired location (e.g., a desired location in the X-Y plane and adjacent to one of the hinge assemblies 200L, 200U—depending upon whether the wire bundle 338 is routed from above or below the compartment housing 112), and then confining the wire bundle (e.g., wire bundle 338) to a defined location with the routing channel (e.g., routing channel 336).

For example, in one embodiment, the wire guard 222 and the hinge mount bracket 224 form surfaces of the routing channel 336 that operate to confine the wire bundle 338 in the X-Y plane. As can be seen in FIG. 3, the hinge mount bracket 224 and a wire guard 222 include surfaces 222S, 224S1, 224S2 that confine the wire bundle 338 to a defined location (e.g., running vertically between surfaces 224S1, 224S2 of the hinge mount bracket 224 and engaging surface 222S of the wire guard 222).

It should be readily appreciated by those persons of ordinary skill in the art that the present disclosure is susceptible of broad utility and application. Many embodiments and adaptations other than those herein described, as well as many variations, modifications, and equivalent arrangements, will be apparent from, or reasonably suggested by, the present disclosure and the foregoing description thereof, without departing from the substance or scope thereof. Accordingly, while the present invention has been described herein in detail in relation to specific embodiments, it is to be understood that this disclosure is only illustrative and is made merely for purposes of providing a full and enabling disclosure of the invention. This disclosure is not intended to limit the invention to the particular apparatus, assemblies, and/or methods disclosed, but, to the contrary, the intention is to cover all modifications, equivalents, and alternatives falling within the scope of the claims.

What is claimed is:

1. An electrical distribution cabinet switchgear component, comprising:
    a compartment housing forming an internal compartment configured to contain secondary electrical components and configured to be coupled to an electrical distribution cabinet;
    a hinge assembly coupled to the compartment housing; and
    a wire guard coupled to the hinge assembly,
    wherein the hinge assembly includes a hinge mount bracket coupled to the compartment housing, a first inner hinge component coupled to the hinge mount bracket, and a first outer hinge component pivotable to the first inner hinge component, the first outer hinge component coupled to the wire guard, and
    wherein the hinge mount bracket includes a first mounting flange configured to mount the first inner hinge component, wherein the first mounting flange extends co-parallel to a side wall of the compartment housing.

2. The switchgear component of claim 1, wherein the hinge assembly includes the hinge mount bracket coupled to the compartment housing, a second inner hinge component coupled to the hinge mount bracket, and a second outer hinge component pivotable to the second inner hinge component, the second outer hinge component coupled to the wire guard.

3. The switchgear component of claim 1, wherein the hinge assembly includes the first outer hinge component and a second outer hinge component each coupled to the wire guard.

4. The switchgear component of claim 1, comprising the hinge mount bracket coupled to the compartment housing and the hinge mount bracket and the wire guard form a routing channel configured to confine a wire bundle.

5. The switchgear component of claim 1, wherein the wire guard has an included bend angle of between about 110 degrees and about 160 degrees.

6. The switchgear component of claim 1, wherein the compartment housing includes a mounting flange on an opposite side of the internal compartment from the hinge assembly and wire guard.

7. The switchgear component of claim 6, wherein the mounting flange includes one or more wire bundle routing recesses.

8. An electrical distribution cabinet switchgear component, comprising:
    a compartment housing forming an internal compartment configured to contain secondary electrical components and configured to be coupled to an electrical distribution cabinet;
    a hinge assembly coupled to the compartment housing;
    a wire guard coupled to the hinge assembly; and
    a frame connector, wherein the wire guard is configured to couple to the frame connector,
    wherein the wire guard comprises a plurality of hanging connection features configured to allow an assembly including the compartment housing, hinge assembly and the wire guard to be hung onto the frame connector.

9. An electrical distribution cabinet switchgear component, comprising:
    a compartment housing forming an internal compartment configured to contain secondary electrical components and configured to be coupled to an electrical distribution cabinet;
    a hinge assembly coupled to the compartment housing;
    a wire guard coupled to the hinge assembly; and
    a frame connector including a first side configured to couple to a first portion of a frame and a second side substantially perpendicular to the first side and configured to couple to a second portion of the frame,
    wherein the wire guard forms an engaging surface that is a planar surface oriented at an offset angle of between about 20 degrees and about 70 degrees from the first side.

10. The switchgear component of claim 9, wherein the frame connector comprises a third side perpendicular to the second side and the wire guard is coupled to the third side.

* * * * *